United States Patent
Jeong et al.

(10) Patent No.: US 9,494,655 B2
(45) Date of Patent: Nov. 15, 2016

(54) APPARATUS FOR DIAGNOSING A STATE OF A FUEL CELL STACK AND METHOD THEREOF

(71) Applicant: Hyundai Motor Company, Seoul (KR)

(72) Inventors: Kwi Seong Jeong, Gyeonggi-do (KR); Sang Bok Won, Seoul (KR); Young Bum Kum, Seoul (KR); Jae Jun Ko, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 207 days.

(21) Appl. No.: 14/566,121

(22) Filed: Dec. 10, 2014

(65) Prior Publication Data

US 2016/0061902 A1 Mar. 3, 2016

(30) Foreign Application Priority Data

Aug. 29, 2014 (KR) ........................ 10-2014-0114444

(51) Int. Cl.
*G01R 31/36* (2006.01)
*H01M 8/04* (2016.01)

(52) U.S. Cl.
CPC ...... *G01R 31/3637* (2013.01); *H01M 8/04559* (2013.01); *H01M 8/04649* (2013.01); *H01M 2250/20* (2013.01); *Y02E 60/50* (2013.01)

(58) Field of Classification Search
CPC .................... G01R 31/3637; H01M 2250/20; H01M 8/04559; H01M 8/04649
See application file for complete search history.

(56) References Cited

FOREIGN PATENT DOCUMENTS

| JP | 2001-236979 A | 8/2001 |
|---|---|---|
| JP | 2012-142122 A | 7/2012 |
| KR | 10-1090705 B | 12/2011 |
| KR | 10-136741 B | 2/2014 |
| KR | 10-1362740 B | 2/2014 |
| KR | 10-1362741 B1 | 2/2014 |
| WO | 2012/091033 A1 | 7/2012 |

*Primary Examiner* — Carlos Barcena
(74) *Attorney, Agent, or Firm* — Mintz Levin Cohn Ferris Glovsky and Popeo, P.C.; Peter F. Corless

(57) ABSTRACT

Disclosed are an apparatus and a method for diagnosing a state of a fuel cell stack with high accuracy by reducing the deviation of a harmonic component although the voltage variation of the fuel cell stack is substantial. According to the present invention, a harmonic component is detected by converting the difference between the voltage of the fuel cell stack and a moving average voltage to a frequency and the state of the fuel cell stack is diagnosed based on the size of the detected harmonic component.

9 Claims, 5 Drawing Sheets

APPARATUS FOR DIAGNOSING A STATE OF A FUEL CELL STACK AND METHOD THEREOF

CROSS-REFERENCE TO RELATED APPLICATION

This application is based on and claims priority from Korean Patent Application No. 10-2014-0114444, filed on Aug. 29, 2014 in the Korean Intellectual Property Office, the disclosure of which is incorporated herein in its entirety by reference.

TECHNICAL FIELD

The present invention relates to an apparatus for diagnosing a state of a fuel cell stack and a method thereof. The state of a fuel cell stack may be diagnosed with high accuracy with the apparatus and the method of the invention, although the variation in the output voltage (DC voltage) of the fuel cell stack is substantial.

BACKGROUND

A fuel cell converts the chemical energy of fuel into the electric energy by electrochemically reacting fuels in a stack to generate electricity, unlike combustion which generates heat. The fuel cell supplies electric power to a small electric/electronic product, particularly to a portable device as well as industrial, household and vehicular power.

Currently, polymer electrolyte membrane fuel cell or proton exchange membrane fuel cell (PEMFC) having the greatest power density has been used as a power supply source for a vehicle, and thus has been most widely studied, since such fuel cell has a fast start-up time and fast power conversion response time due to its low operating temperature.

The PEMFC includes a membrane electrode assembly (MEA) including the catalyst electrode layers for electro-chemical reaction and the solid polymer electrolyte membrane where the catalyst electrode layers are attached to both side thereof and protons move through; a gas diffusion layer (GDL) which uniformly distributes the reaction gas and transfers generated electrical energy; a gasket and a locking unit for maintaining the airtightness and the proper tightening pressure of reaction gases and cooling water; and a bipolar plate where reaction gases and cooling water moves.

When the fuel cell stack is assembled using the above described unit cell components, the combination of the MEA and the GDL is positioned innermost part of the cell, the MEA where the catalyst electrode layers such as an anode and cathode are applied to both sides of the polymer electrolyte membrane for reacting hydrogen and oxygen, and a gas diffusion layer, gasket are laminated sequentially on the outer portion where the anode and the cathode are positioned.

A bipolar plate is positioned outside of the gas diffusion layer, and the bipolar plate supplies the reaction gases such as fuel, hydrogen and oxidant, oxygen or air. In addition, a flow path passing cooling water is formed in the bipolar plate.

Then, a plurality of unit cells are stacked, and then a current collector, an insulating plate and an end plate for supporting the stacked cells are combined in the outermost position, and the fuel cell stack is configured by repeatedly stacking and tightening the unit cells between the end plates.

The unit cells are stacked to obtain the sufficient electric potential for a vehicle power source, and hereafter, stacking unit cells is referred to as a stack. For example, an electric potential generated from one unit cell is about 1.3 V, and a number of cells are stacked in series to generate the power for driving a vehicle.

Meanwhile, in the fuel cell vehicle, a portion of the output voltage of the stack is used to diagnose the state of a fuel cell.

In the related arts, a method for diagnosing a state of a fuel cell has been developed. After an alternating current such as sine wave is applied to the fuel cell stack, the output voltage of the fuel cell stack is measured, the measured voltage is frequency converted and the harmonic component is detected, and then the state of the fuel cell stack is diagnosed by detecting the linearity or non-linearity of the fuel cell stack based on the detected harmonic component.

However, because the harmonic component is detected by using the output voltage of the fuel cell stack, when the variation of the output voltage is substantial, the deviation of the harmonic component may increase due to the mix of the harmonic component by the voltage variation, and as consequence, detection accuracy for the harmonic component is reduced.

The description provided above as a related art of the present invention is just merely for helping understanding of the background of the present invention and should not be construed as being included in the related art known by those skilled in the art.

SUMMARY OF THE INVENTION

The present invention provides an apparatus and a method for diagnosing the state of a fuel cell stack with high accuracy by reducing the deviation of a harmonic component, although voltage variation of the fuel cell stack is substantial. As such, a harmonic component may be detected by converting the difference between the voltage of the fuel cell stack and a moving average voltage to a frequency and the state of the fuel cell stack may be diagnosed based on the size of the detected harmonic component.

In an exemplary embodiment, an apparatus for diagnosing a state of a fuel cell stack of the present invention may include: an alternating current applying device configured to apply an alternating current to a direct current of the fuel cell stack; a voltage measurer configured to measure a voltage of the fuel cell stack; a moving average voltage calculator configured to calculate a moving average voltage based on the voltage measured by the voltage measurer; a voltage difference calculator configured to calculate a difference between the voltage of the fuel cell stack measured by the voltage measurer and the moving average voltage calculated by the moving average voltage calculator; a VF (Voltage-Frequency) converter configured to convert a result calculated by the voltage difference calculator to a frequency; and a diagnosis device configured to diagnose the state of the fuel cell stack based on a size of harmonic components in the frequency converted by the VF converter.

In an exemplary embodiment, a method for diagnosing a state of a fuel cell stack of the present invention may include: applying, by an alternating current applying device, an alternating current to a direct current of the fuel cell; measuring, by a voltage measurer, a voltage of the fuel cell stack; calculating, by a moving average voltage calculator, a moving average voltage based on the measured voltage; calculating, by a voltage difference calculator, a difference between the measured voltage of the fuel cell stack and the calculated moving average voltage; converting, by a VF (Voltage-Frequency) converter, the calculated voltage difference to a frequency: and diagnosing, by a diagnosis device, the state of the fuel cell stack based on a size of harmonic components in the converted frequency.

Further provided are fuel cell system that use or comprise an apparatus of the invention as described above to diagnose the state of the fuel cell stack with high accuracy. Still further provided are vehicles that use or comprise an apparatus of the invention as described above to diagnose the state of the fuel cell stack with high accuracy. In addition, provided are fuel cell systems or vehicles comprising the apparatus that use the method as described above to diagnose the state of the fuel cell stack with high accuracy.

According to various exemplary embodiments of the present invention, the state of the fuel cell stack may be diagnosed with high accuracy by reducing the deviation of a harmonic component although the voltage variation of the fuel cell stack is substantial. For example, a harmonic component may be detected by converting the difference between the voltage of the fuel cell stack and a moving average voltage to a frequency, and the state of the fuel cell stack may be diagnosed based on the size of the detected harmonic component.

Other aspects of the invention are disclosed infra.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Figure 1:
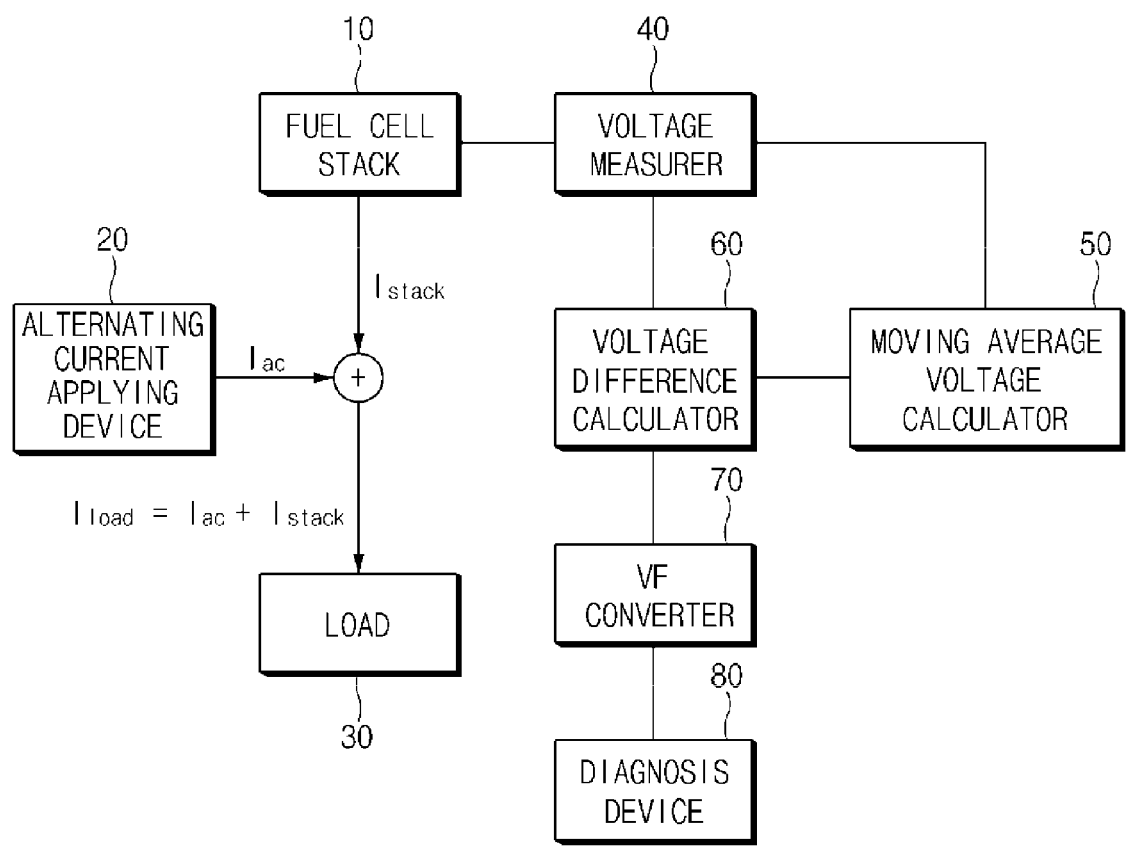
FIG. 1 illustrates an exemplary apparatus for diagnosing a state of an exemplary fuel cell stack according to an embodiment of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The foregoing objects, features and advantages will be more apparent through the detail description as below with reference to the accompanying drawings, and thus the those skilled in the art can be easily embody the technical spirit of the present invention. Further, in the following description of the present invention, if it is determined that the detailed description for the known art related to the present invention unnecessarily obscures the gist of the present invention, the detailed description thereof will be omitted. Hereinafter, with reference to the accompanying drawings, preferred embodiments of the present invention will be described in detail.

FIG. 1 illustrates an exemplary apparatus for diagnosing a state of an exemplary fuel cell stack according to an exemplary embodiment of the present invention.

As shown in FIG. 1, an apparatus for diagnosing a state of a fuel cell stack may include: a fuel cell stack 10, an alternating current applying device 20, a load 30, a voltage measurer 40, a moving average voltage calculator 50, a voltage difference calculator 60, a VF (Voltage-Frequency) converter 70 and a diagnosis device 80. The fuel cell stack 10, the alternating current applying device 20, the load 30, the voltage measurer 40, the moving average voltage calculator 50, the voltage difference calculator 60, the VF converter 70, and the diagnosis device 80 may be operated by a controller.

The fuel cell stack 10 provides the power for driving a vehicle.

The alternating current applying device 20 may be configured to apply an alternating current $I_{ac}$ to the direct current $I_{stack}$ supplied to the load 30 such that the component of the alternating voltage may appear on the output voltage of the fuel cell stack 10. When alternating current is applied to the direct current supplied to the load 30, the component of the alternating voltage may appear on the output voltage of the fuel cell stack 10.

The current $I_{load}$, as used herein, is presented as $I_{load} = I_{stack} + I_{ac}$. As such, the direct current $I_{stack}$ and the alternating current $I_{ac}$ may be added and supplied to the load 30.

The voltage measurer 40 may measure the output voltage of the fuel cell stack.

The moving average calculator 50 may calculate the moving average voltage based on the voltage measured by the voltage measurer 40. The moving average calculator 50 may calculate the moving average voltage of one alternating period unit by using the following [Equation 1]

$$\text{MOVING AVERAGE VOLTAGE}(n) = \quad \text{[Equation 1]}$$

$$\frac{\text{MOVING AVERAGE VOLTAGE}(n-1) \times N - \text{VOLTAGE}\left(n - \frac{N}{2}\right) + \text{VOLTAGE}\left(n + \frac{N}{2}\right)}{N}$$

As used herein, N refers to a number of the sample in 1 period, and n refers to an order of the moving average voltage.

The voltage difference calculator 60 may be configured to calculate the difference which is presented as $V_{stack} - V_{Mov}$, when the voltage $V_{stack}$ of the fuel cell stack 10 is measured by the voltage measurer 40 and the moving average voltage $V_{Mov}$ is calculated by the moving average voltage calculator 50.

The VF converter (Voltage-Frequency Converter) 70 may be configured to convert the result $V_{stack} - V_{Mov}$ calculated by the voltage difference calculator 60 to a frequency, based on FFT (Fast-Fourier Transform) conversion.

The diagnosis device 80 may be configured to diagnose the state of the fuel cell stack 10 based on the size of a harmonic component in the frequency converted by the VF converter 70.

In other words, the diagnosis device 80 may be configured to determine the state of the fuel cell stack 10 as an abnormal state when the size of the harmonic component is greater than a first threshold value. The diagnosis device 80 may be configured to determine the state of the fuel cell stack 10 as a normal state when the size of the harmonic component is equal to or less than a second threshold value. In particular, the first threshold value may be greater than the second threshold value, or the first threshold value may be equal the second threshold value.

Typically, while the voltage/current characteristic of the voltage of the fuel cell stack 10 during operation in the normal state is linear, the voltage/current characteristic of the voltage of the fuel cell stack 10 during operation in the abnormal state is non-linear. Accordingly, if the non-linearity of the voltage of the fuel cell stack 10 is measured, the state of the fuel cell stack 10 may be determined as an abnormal state.

In addition, when a sine wave current is added to a load current and the load current is applied, the voltage of the normal fuel cell stack 10 may be changed in the linear region, the voltage of the abnormal fuel cell stack 10 may be changed in the non-linear region.

Further, the non-linearity may appear as harmonic component in the frequency analysis, while the voltage of the normal fuel cell stack 10 show that the size of the harmonic wave is reduced, the voltage of the abnormal fuel cell stack 10 may appear that the size of the harmonic wave is increased.

Figure 2:
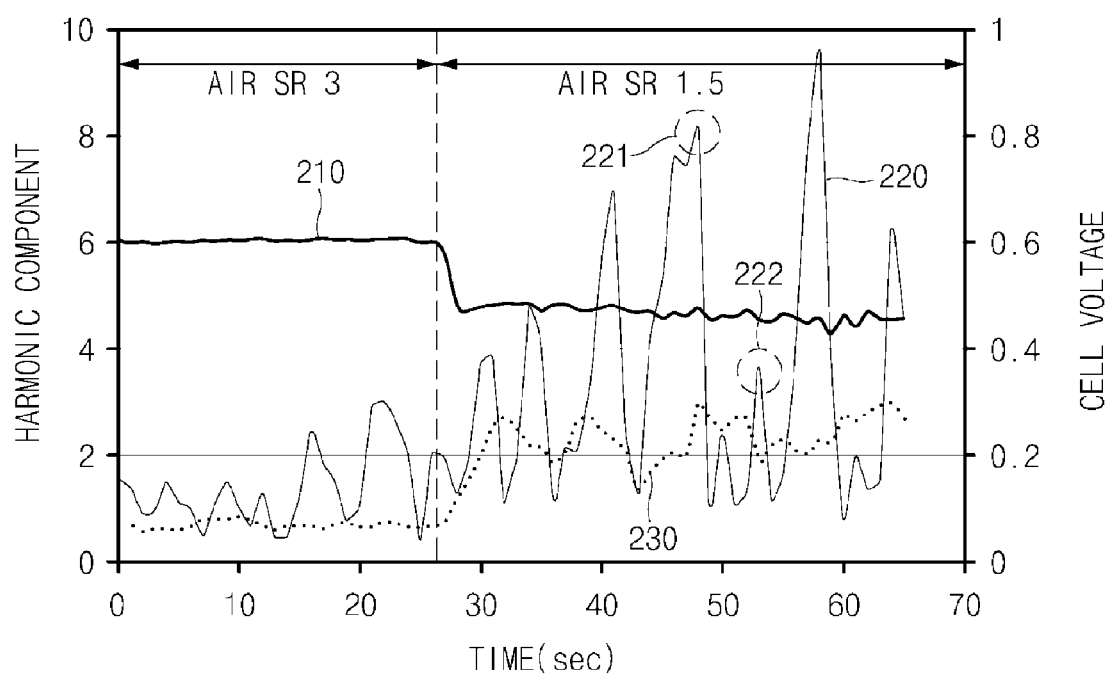
FIG. 2 illustrates an exemplary diagram showing the performance of an exemplary apparatus for diagnosing a state of an exemplary fuel cell stack according to an exemplary embodiment of the present invention.

FIG. 2 shows a performance of an exemplary apparatus for diagnosing a state of a fuel cell stack according to an exemplary embodiment of the present invention.

In FIG. 2, '210' refers to the voltage of the fuel cell stack 10; '220' refers to the magnitude of the harmonic component detected by using the voltage of the fuel cell stack 10; and '230' refers to the magnitude of the harmonic component detected by using the result of $V_{stack} - V_{Mov}$ calculated by the voltage difference calculator 60. Also, air SR (Stoichiometry Ratio) 3 may refer that the fuel cell stack 10 is normally operating, and air SR 1.5 may refer that the fuel cell stack 10 is abnormally operating.

As shown in FIG. 2, "220" may indicate that the size variation of the harmonic component is increased, '230' may indicate that the size of the harmonic components is reduced.

Figure 3:
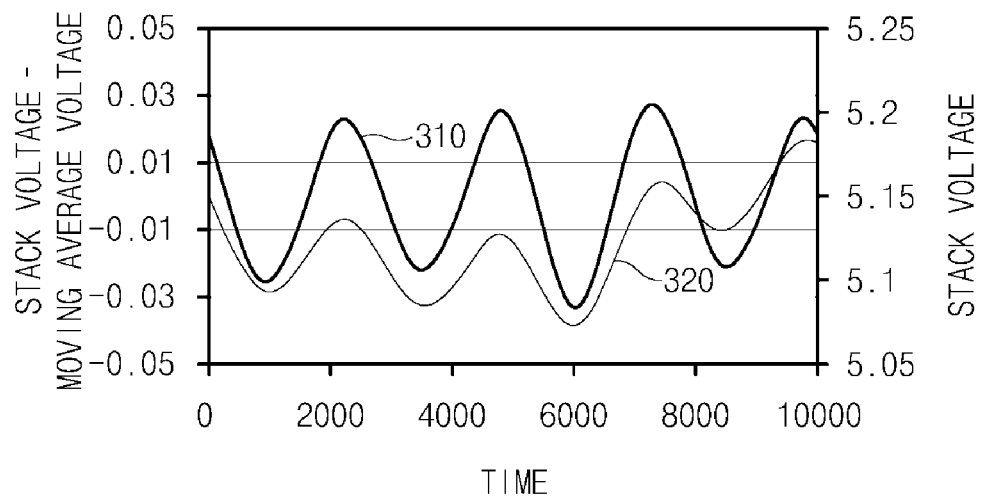
FIG. 3 shows an exemplary stack voltage of an exemplary fuel cell when output voltage variation of a fuel cell stack is increased and an exemplary result subtracting a moving average voltage from an exemplary stack voltage according to an exemplary embodiment of the present invention.

FIG. 3 shows an exemplary voltage of the fuel cell stack 10 at the time point 221 which size of the harmonic components in increased when the variation is increased.

Figure 4:
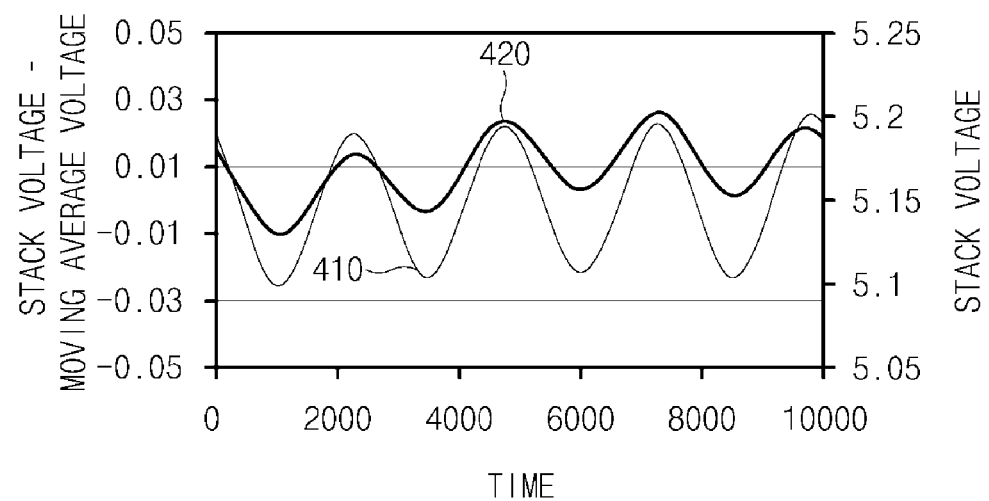
FIG. 4 shows an exemplary stack voltage of an exemplary fuel cell when output voltage variation of an exemplary fuel cell stack is reduced and an exemplary result subtracting a moving average voltage from an exemplary stack voltage according to an exemplary embodiment of the present invention.

FIG. 4 shows an exemplary the voltage of the fuel cell stack 10 at the time point 222 which size of the harmonic components is reduced when the variation is reduced, and an example is shown in FIG. 4.

Accordingly, through FIG. 2 to FIG. 4, the conventional method using the voltage of the fuel cell stack 10 may sensitively react to the voltage variation of the fuel cell stack 10 such as the deviation of the size of the harmonic components is large. In contrast, the method using the result $V_{stack} - V_{Mov}$ calculated by the voltage difference calculator 60 according to the present invention may not be sensitively influenced on the voltage variation, such as the deviation of the size of the harmonic components is small.

Figure 5:
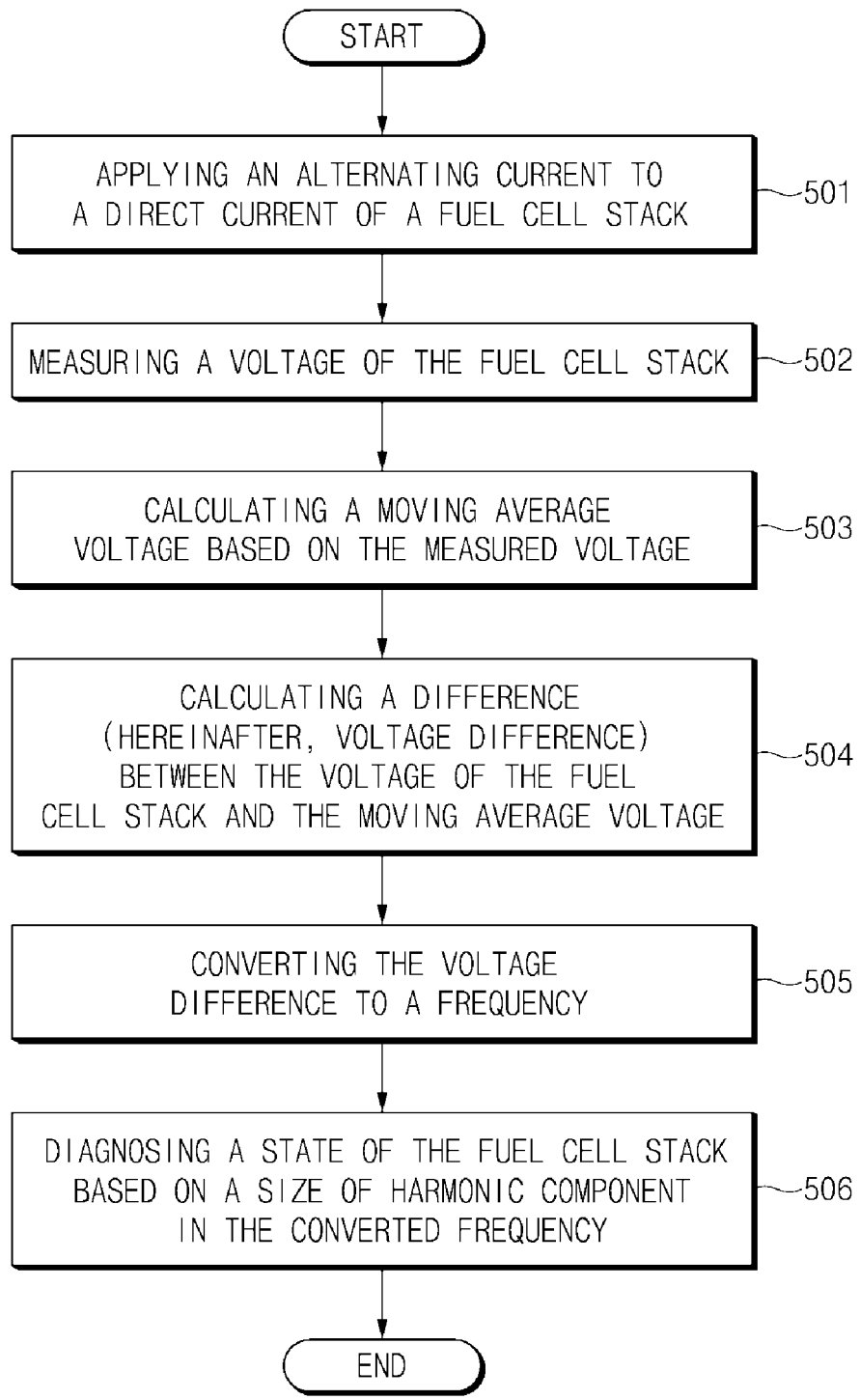
FIG. 5 illustrates an exemplary method for diagnosing a state of an exemplary fuel cell stack according to an exemplary embodiment of the present invention.

FIG. 5 is an exemplary method for diagnosing a state of an exemplary fuel cell stack according to an exemplary embodiment of the present invention.

The alternating current applying device 20 may be configured to apply an alternating current to the direct current of the fuel cell stack 10 (501).

Subsequently, the voltage measurer 40 may be configured to measure the voltage of the fuel cell stack 10 (502).

Then, the moving average voltage calculator 50 may be configured to calculate the moving average voltage based on the voltage measured by the voltage measurer 40 (503).

The voltage difference calculator 60 may be configured to calculate the difference (hereinafter, voltage difference) between the voltage of the fuel cell stack measured by the voltage measurer 40 and the moving average voltage calculated by the moving average voltage calculator 50 (504).

Then, VF (Voltage-Frequency) converter 70 may be configured to convert the voltage difference calculated by the voltage difference calculator 60 to a frequency (505).

The diagnosis device 80 may be configured to diagnose the state of the fuel cell stack 10 based on the size of the harmonic components in the frequency converted by the VF converter 70 (506).

In addition, as the above described, the method of the present invention can be implemented as a computer program. And, codes and code segments constituting the program can be easily inferred by a computer programmer in the art. Further, the created program is stored on a recording medium (information storage medium) in a computer-readable, read and executed by a computer, thereby implementing the method of the present invention. And, the recording medium includes all type of recording medium which can read by a computer.

As the above described, although the present invention is explained by particular configurations and drawings, the technical concept of the invention is not limited to the aforementioned embodiments, and various modification and changes may be made within the equivalents of the technical concept of the present invention and the appended claims by those skilled in the art.

What is claimed is:

1. An apparatus for diagnosing a state of a fuel cell stack, comprising:
    an alternating current applying device configured to apply an alternating current to a direct current of the fuel cell stack;
    a voltage measurer configured to measure a voltage of the fuel cell stack;
    a moving average voltage calculator configured to calculate a moving average voltage based on the voltage measured by the voltage measurer;
    a voltage difference calculator configured to calculate a difference between the measured voltage of the fuel cell stack and the calculated moving average voltage;
    a VF (Voltage-Frequency) converter configured to convert a calculated result to a frequency: and
    a diagnosis device configured to diagnose the state of the fuel cell stack based on a size of harmonic components in the converted frequency.

2. An apparatus of claim 1, wherein the diagnosis device is configured to determine the state of the fuel cell stack as an abnormal state when the size of the harmonic components is greater than a first threshold value, and determine the state of the fuel cell stack as a normal state when the size of the harmonic components is equal to or less than a second threshold value.

3. An apparatus of claim 2, wherein the first threshold value has a value greater than the second threshold value.

4. A method for diagnosing a state of a fuel cell stack, comprising:
    applying, by a controller, an alternating current to a direct current of the fuel cell stack;
    measuring, by the controller, a voltage of the fuel cell stack;
    calculating, by the controller, a moving average voltage based on the measured voltage;
    calculating, by the controller, a difference between the measured voltage of the fuel cell stack and the calculated moving average voltage;
    converting, by the controller, the calculated voltage difference to a frequency; and
    diagnosing, by the controller, the state of the fuel cell stack based on a size of harmonic components in the converted frequency.

5. A method of claim 4, further comprising:
    determining, by the controller, the state of the fuel cell stack as an abnormal state when the size of the harmonic components is greater than a first threshold value; and
    determining, by the controller, the state of the fuel cell stack as a normal state when the size of the harmonic components is equal to or less than a second threshold value.

6. A method of claim 5, wherein the first threshold value has a value greater than the second threshold value.

7. A fuel cell system comprises an apparatus of claim 1 to diagnose a state of the fuel cell stack.

8. A vehicle comprises a fuel cell system of claim 7 to diagnose a state of the fuel cell stack.

9. A non-transitory computer readable medium containing program instructions executed by a controller, the computer readable medium comprising:
    program instructions that apply an alternating current to a direct current of the fuel cell stack;
    program instructions that measure a voltage of the fuel cell stack;
    program instructions that calculate a moving average voltage based on the measured voltage;
    program instructions that calculate a difference between the measured voltage of the fuel cell stack and the calculated moving average voltage;
    program instructions that convert the calculated voltage difference to a frequency; and
    program instructions that diagnose the state of the fuel cell stack based on a size of harmonic components in the converted frequency.

* * * * *